United States Patent [19]

Fukutani et al.

[11] 4,063,953
[45] Dec. 20, 1977

[54] PHOTOSENSITIVE COMPOSITION

[75] Inventors: Hideo Fukutani, Tokyo; Konoe Miura; Yoshihiro Takahashi, both of Yokohama; Kazuo Torige, Kanagawa, all of Japan

[73] Assignee: Mitsubishi Chemical Industries, Ltd., Tokyo, Japan

[21] Appl. No.: 637,278

[22] Filed: Dec. 3, 1975

Related U.S. Application Data

[63] Continuation of Ser. No. 394,497, Sept. 5, 1973, abandoned.

[30] Foreign Application Priority Data

Sept. 6, 1972 Japan .................................. 47-89326

[51] Int. Cl.$^2$ ............................................. G03C 1/68
[52] U.S. Cl. ............................... 96/115 R; 204/159.2
[58] Field of Search ............... 96 115 R/; 260/32.8 R; 204/159.14, 159.20

[56] References Cited

U.S. PATENT DOCUMENTS

| | | | |
|---|---|---|---|
| 2,610,120 | 9/1952 | Minsk | 95/7 |
| 3,694,383 | 9/1972 | Azami et al. | 96/115 R |
| 3,817,757 | 6/1974 | Yabe et al. | 96/115 R |
| 3,817,876 | 6/1974 | Fukutani et al. | 260/2 |

FOREIGN PATENT DOCUMENTS 2,015,332  4/1970  France ..................... 260/32.8 R

*Primary Examiner*—Jack P. Brammer
*Attorney, Agent, or Firm*—Oblon, Fisher, Spivak, McClelland & Maier

[57] ABSTRACT

A photosensitive composition is prepared from a mixture of a photosensitive resin containing radicals having the formula

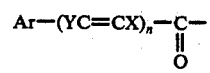

wherein X and Y represent hydrogen, halogen, cyano or nitro, Ar represents an aryl radical or a substituted aryl radical, and n represents 1 or 2, and a solvent having the formula

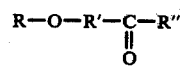

wherein R and R'' represent a lower alkyl radical and R' represents a lower alkylene radical.

3 Claims, No Drawings

PHOTOSENSITIVE COMPOSITION

This is a continuation of application Ser. No. 394,497, filed Sept. 5, 1973, now abandoned.

BACKGROUND OF THE INVENTION

1. Field of the Invention

This invention relates to photosensitive compositions. More particularly, the invention relates to photosensitive compositions which have a high resolving power and high reproducibility and which are suitable for use in the formation of relief images and in photo-etching processes.

2. Description of the Prior Art

Many systems are known in which a photosensitive synthetic resin is coated on a suitable support or substrate as a thin layer, and then the coated layer is exposed to light through a mask whereby the unexposed portion of the coated layer is removed by dissolution in a solvent leaving the exposed material behind. This type of procedure has been found useful in many industrial processes such as printing, precision processing, printed circuits, the manufacture of integrated circuits (IC) and the like. However, the conventional photosensitive resin systems have several disadvantages when used in these applications, and a number of improvements have been proposed to overcome these disadvantages. These improvements have been particularly applicable to processes in which fine line patterns must be reproduced such as in the photofabrication field, the electronics field, and particularly in the manufacture of integrated circuits, and LSI.

Certain factors affect the coating characteristics of the material which is coated. The most important factor is to achieve a coating which forms a thin uniform membrane on substrate such as metal plates, glass plates, silicon wafers and the like without the presence of pin holes in the membrane. The most important factor for determining the characteristics of the coating step is the combination of the photosensitive resin used with the solvent in the photosensitive compositions, and a need continues to exist for photosensitive resins which have a high reproducibility and high resolving power.

SUMMARY OF THE INVENTION

One object of the invention is to provide photosensitive compositions which have a high resolving power and a high reproducibility.

Briefly, these objects and other objects of the invention as hereinafter will become more readily apparent can be attained by a photosensitive composition which comprises a photosensitive resin containing radicals having the formula $$\text{Ar}-(\text{YC}=\text{CX})_n-\underset{\underset{\text{O}}{\|}}{\text{C}}- \quad (1)$$

wherein X and Y represent hydrogen, halogen or a cyano or nitro radical, Ar represents an aryl or a substituted aryl radical such as benzene, lower alkyl benzene, chloro or bromo benzene, lower alkoxy benzene, lower alkylene benzene, or napthalene, etc. and n represents 1 or 2; and a solvent having the formula $$\text{R}-\text{O}-\text{R}'-\underset{\underset{\text{O}}{\|}}{\text{C}}-\text{R}'' \quad (2)$$

wherein R and R'' represent a lower alkyl radical and R' represents a lower alkylene radical. The term "lower" is intended to include $C_{1-8}$ groups.

DESCRIPTION OF THE PREFERRED EMBODIMENTS

The photosensitive compositions of the invention comprise a photosensitive resin which contains a radical having the formula (1). The resins also contain units of the formula:

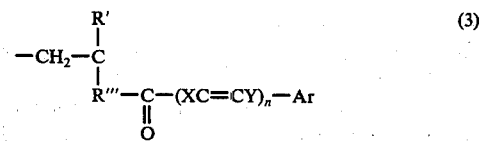

wherein R''' represents an oxygen or a hydrocarbon moiety which contains an oxygen or sulfur atom, such as lower alkoxy, lower alkyl thio ether or the like and R' represents hydrogen or a lower alkyl. The photosensitive resins of this invention can be prepared by reacting cinnamic acid or a derivative thereof with polyvinyl alcohol or the like. Suitable vinyl cinnamates include polyvinyl cinnamate, poly(vinyl m-nitro-cinnamate), poly (vinyl α-cyanocinnamate), poly(vinyl α-nitro-cinnamate), poly(vinyl β-nitro-cinnamate), poly(vinyl α-chlorocinnamate), poly(vinyl β-chloro-cinnamate), poly(vinyl cinnamylidene acetate), polyvinyloxyethyl cinnamate, polyvinylthioethyl cinnamate, poly(2-cinnamoyloxyethyl acrylate), poly (2-cinnamoyloxyethyl methacrylate), poly (vinyl cinnamoyloxyacetate), poly(p-cinnamoyloxyvinylbenzene), poly(p-cinnamoylstyrene), and the like or copolymers of the monomer and another comonomer and an oxirane ring containing cleavage polymer such as polyglycidyl cinnamate, poly(glycidyl p-nitrocinnamate), poly (glycidyl α-cyanocinnamate), poly(glycidyl cinnamylidene acetate) and the like. Suitable polymers containing photosensitive groups whole or in part which are produced by reacting a polymer containing haloalkyl groups as side chains with a salt of a carboxylic acid containing photosensitive groups in a dipolar aprotic solvent can also be used. For example, the polymers can be produced by reacting polychloroethylvinyl ether, polyvinyl chloroacetate, poly β-chloroethyl acrylate), polyepichlorohydrin, or polyepibromohydrin with cinnamic acid or a derivative thereof.

The photosensitive resins are used by dissolving them in a solvent. The solvents should have the characteristics of having the ability to substantially dissolve the photosensitive resin; to form uniform thin membranes when coated; to help maintain a suitable sensitivity; to stabilize the resin as it ages upon storing and the like. When conventional solvents are used to dissolve the photosensitive resins such as acetone, methylethylketone, tetrahydrofuron, dioxane, benzene, toluene, diacetoneglycol and the like, the solubility obtained is insufficient. Also, inferior membranes are formed and the resins have a low resolving power when xylene, trichlene, N-methylpyrrolidone, dimethylformamide, methylcellosolve acetate, ethylcellosolve acetate, or the like is used as a solvent. In the photosensitive compositions of the invention, a solvent having the formula (2) or mixtures thereof can be used with a conventional solvent. Suitable solvents having the formula (2) include ketoethers such as 1-methoxypropanone-2, 1-ethoxypropanone-2, 4-methoxybutanone-2, 4-ethoxybutanone-2, 1-methoxypentanone-2, 1-ethoxypentanone-2, 1-methoxypentanone-3, 1-ethoxypentanone-3, 4-methoxy-4-methylpentanone-2, 4-ethoxy-4-methylpentanone-2, and the like. Preferably 4-methoxybutanone-2, 1-methoxypentanone-2, 1-ethoxypentanone-2, 1-ethoxypentanone-2, 1-methoxypentanone-3, or 1-ethoxypentanone-3 is used. Most preferably, 4-ethoxybutanone-2, 4-methoxy-4-methyl pentanone-2 or 4-ethoxy-4-methyl-pentanone-2 is used.

The amount of the solvent used to dissolve the resin generally is in excess of the amount required to dissolve the resin components. It is possible to add a conventional sensitizer such as an aromatic nitro compound, which includes trinitroaniline, nitronaphthalene, 5-nitroacenaphthene, 2-nitrofluorene, picramide or the like; a ketone such as benzophenone, Michler's ketone or the like; a quinone; naphthoquinone; anthraquinone; 2,3-diphenylanthraquinone; 1,2-benzanthraquinone or the like; anthrones or pyrylium salts in order to spectrally sensitize the photosensitive compositions. The sensitizer is usually added in amounts ranging from 0.1 –10% by weight based on the photosensitive resin. Stabilizers such as hydroquinone, tertbutyl catechol or the like; a plasticizer such as triacetin, triethyleneglycol dipropionate or the like; a dyestuff; or a pigment can also be effectively added to the compositions depending upon the desired. Suitable supports and substrates which are coated with the phthosensitive composition of the invention include metals, plastics, silicon wafers, glass, paper, and the like.

The photosensitive composition of the invention can be applied by any conventional process whereby the photosensitive composition is coated on a pretreated substrate by dipping, spraying, roller coating or the like. The coated layer is then exposed through a mask and the unexposed portions of the resin are removed by a suitable developing solution. The treated substrate is then etched after a post baking step whereby a fine image is formed on the substrate.

The photosensitive compositions of the invention have excellent characteristics which include a high sensitivity, good acid resistance, good thermal stability, good resolving power, good reproducibility, a good membrane formation ability and the like. These characteristics broaden the fields of applicability of the photosensitive compositions. For example, the photosensitive compositions can be used as photoresist for the manufacture of printing plates for printed circuit wiring, integrated circuits, LSI, chemical milling, relief printing, intaglio processing, precision processes and the manufacture of name plates, and the like. The photosensitive compositions are especially useful in precision processing techniques and electronics because of the high resolving power, high reproducibility, and excellent coated membrane characteristics of the compositions.

Having generally described the invention, a more complete understanding can be obtained by reference to certain specific examples, which are included for purposes of illustration only and are not intended to be limiting unless otherwise specified.

PREPARATION OF RESIN 1

A 6.5 g amount of polyepichlorohydrin was dissolved in 227 ml of dimethylformamide while heated under a nitrogen atmosphere. In addition, 13.6 g of cinnamic acid was dissolved in 177 ml of benzene and then 38.3 g of a 40% methanol solution of trimethylbenzyl ammonium hydroxide was admixed with the solution. Trimethylbenzyl ammonium cinnamate was isolated when the benzene solvent was evaporated in addition to the methanol and the water formed by the neutralization reaction. The product obtained was admixed with the solution of polyepichlorohydrin and the mixture was reacted at 80° C for 6.5 hours. The reaction mixture was mixed with methanol and 12 g of a rubber-like white polymer was obtained. Infrared spectrum analysis and elemental analysis of the product indicated that the polymer was a photosensitive resin having units ① and ② wherein the ratio of ① to ② was 71% to 29%.

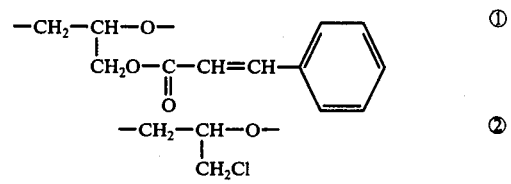

EXAMPLE 1

A 7 g amount of the photosensitive resin prepared as described in Preparation of Resin 1 was dissolved in 100 ml of 4-methyl-4-methoxypentanone-2. A 70mg amount of 5-nitroacenaphthene was added to the mixture as a sensitizer and the mixture was purified with a centrifugal separator and a millpore filter whereby a photosensitive composition was obtained. The composition was coated with a spinner on a glass plate coated with vapor deposited chromium. The coated plate was prebaked at 100° C for 10 minutes by vacuum drying and the coated plate was exposed for 10 seconds at a 120 cm distance from the source of a high pressure mercury lamp (manufactured by Ushio Denki K. K. under the trade name of Unipalse UM-301). A mixture of xylene and monochlorobenzene (2:1 by volume) was sprayed on the coated plate as a developing solution, and the plate was rinsed with solvent naphtha and was post-baked at 170° C for 20 minutes. The chromium layer of the resulting plate was etched with an acidic etchant. The unreacted resin layer was removed and the resulting image was evaluated. The following excellent characteristics were observed.

Pin holes: According to the microscopic observation, the number of pin holes was 0 - 4.

Resolving power: A fine pattern having a width of 1-2 μ precisely reproduced in the shape of the mask.

Linearity: A fine pattern with good linearity having a width of 1-2 μ was found.

Sharpness of pattern: The pattern was sharp and exhibited no side etching.

As a reference experiment 4-methyl-4-methoxypentanone-2 was replaced with benzene, tetrahydrofuran or acetone in the preparation of the composition. The photosensitive resin did not dissolve in the solvent. When benzene was used, the photosensitive resin was transparent and swelled. When tetrahydrofuran was used, it had a white muddy color. When acetone was used, it was white and swelled.

EXAMPLE 2

A 3.5 g amount of the photosensitive resin prepared by the procedure described in Preparation of Resin 1 was dissolved in 50 ml of 4-ethoxybutanone-2. A 35 mg amount of benzanthrone was added to the solution as a sensitizer, and the mixture was purified in accordance with the procedure of Example 1 to prepare a photosensitive composition. The photosensitive composition was coated with a spinner on a silicon wafer coated with an oxide layer having a thickness of 1.15 μ. The photoetching process was applied as described in Example 1 to the coated silicon wafer in order to form the window used in the manufacture of an integrated circuit was completed. According to observation taken with a differential interfero-microscope, fine patterns having a width of 1.5 μ and 2.0 μ were reproduced in the same shape of the mask.

PREPARATION OF RESIN 2

The process of Preparation of Resin 1 was followed and the reaction of poly (β-chloroethylvinylether) and trimethylbenzyl ammonium cinnamate was performed at 110° C for 5 hours in dimethylformamide under an argon atmosphere, in order to prepare a photosensitive resin containing units ③ and ④ wherein the ratio of ③ to ④ was 65% to 35%.

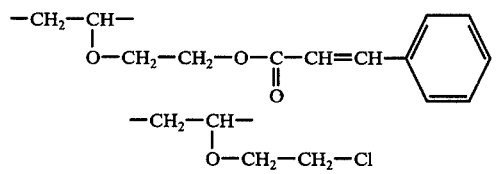

EXAMPLE 3

A 4.0 g amount of the photosensitive resin prepared as described in the Preparation of Resin 2 was dissolved in 80 ml of 4-methoxy-4-methylpentanone-2 and 40 mg of Michler's ketone was added to the solution as a sensitizer. The mixture was purified as described in Example 1 whereby a photosensitive composition was obtained. The photosensitive composition was coated on a clean substrate for printed wiring, and the coated substrate was dried, exposed, developed, and post-baked in accordance with the procedure of Example 1 whereby a clear relief image was formed on the substrate. The treated substrate was etched with ferric chloride and the desired printed wiring plate was obtained. When 1-ethoxypentanone-2 or 1-methoxypentanone-3 was used as the solvent instead of 4-methoxy-4-methylpentanone-2, similar satisfactory printed wiring plates were obtained.

EXAMPLE 4

A 5 g amount of polyvinyl cinnamate prepared by an aqueous alkali solution method was dissolved in 60 ml of 4-ethoxybutanone-2 and 0.25 g of 5-nitroacenaphthene was added to the solution. The mixture was purified by centrifugal separation and a millipore filter whereby a photosensitive composition was obtained. As a reference experiment the polyvinyl cinnamate was dissolved in methylcellosolve acetate and a second photosensitive composition was obtained. Each of the photosensitive compositions were coated on a glass plate which had been previously coated with a chromium layer by a spinner. The coated layer was exposed to a 500 W supper high pressure mercury lamp and was developed with a mixture of xylene and methyl-cellosolve acetate (4:1 by volume). The treated plates were dried and then dipped in an etching solution to etch the chromium. The resulting sample was magnified by a factor of 100 (10 × 10) and the number of pin holes over ¼ of the observed area were measured. The results are shown in the following table together with the reference experiment.

| rotation of spinner or coating | Example 4 | Reference |
|---|---|---|
| 2,000 rpm | 0 | 8 |
| 4,000 | 2 | 50 |
| 6,000 | 4 | infinite |

As is clear from the results, the uniform and firmly coated membrane of Example 4 had only very small pin holes and the increase in the number of pin holes was lower as the coated membrane decreased in thickness in comparison to the membrane of the reference experiment which used a conventional solvent.

Having now fully described the invention, it will be apparent to one of ordinary skill in the art that many changes and modifications can be made thereto without departing from the spirit or scope of the invention as set forth herein.

What is claimed as new and intended to be covered by Letters Patent of the United States is:

1. A photosensitive composition which consists essentially of: a photosensitive amount of a photosensitive resin containing units of the formulas:

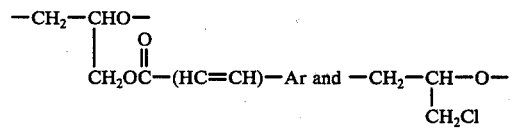

wherein Ar is phenyl in an amount of 4-methoxy-4-methylpentanone -2, 4-ethoxy-butanone-2 or 4-ethoxy-4-methylpentanone-2 sufficient to dissolve said photosensitive resin, to maintain an acceptable sensitivity of said composition, to stabilize said resin upon storage and to permit a uniform thin membrane to form when said composition is coated.

2. The photosensitive composition of claim 1 which can be used as a photoresist or for photographic printing plates.

3. The photosensitive composition of claim 1, which further consists essentially of a sensitizer.

* * * * *